(12) United States Patent
Rhyner et al.

(10) Patent No.: US 8,674,505 B2
(45) Date of Patent: Mar. 18, 2014

(54) INTEGRATED CIRCUIT PACKAGING WITH BALL GRID ARRAY HAVING DIFFERENTIAL PITCH TO ENHANCE THERMAL PERFORMANCE

(75) Inventors: Kenneth R. Rhyner, Rockwall, TX (US); Peter Harper, Gilroy, CA (US)

(73) Assignee: Texas Instruments Incorporated, Dallas, TX (US)

( * ) Notice: Subject to any disclaimer, the term of this patent is extended or adjusted under 35 U.S.C. 154(b) by 125 days.

(21) Appl. No.: 13/343,880

(22) Filed: Jan. 5, 2012

(65) Prior Publication Data

US 2013/0175684 A1 Jul. 11, 2013

(51) Int. Cl.
*H05K 1/02* (2006.01)

(52) U.S. Cl.
USPC ..... 257/738; 257/737; 257/778; 257/E23.023

(58) Field of Classification Search
USPC .......................................... 257/737, 738, 778
See application file for complete search history.

(56) References Cited

U.S. PATENT DOCUMENTS

| | | | | |
|---|---|---|---|---|
| 5,279,894 A | * | 1/1994 | Hoffman et al. | 428/305.5 |
| 7,141,819 B2 | * | 11/2006 | Maruko | 257/48 |
| 7,372,169 B2 | * | 5/2008 | Chang | 257/786 |

* cited by examiner

*Primary Examiner* — Roy Potter
(74) *Attorney, Agent, or Firm* — Steven A. Shaw; Wade James Brady, III; Frederick J. Telecky, Jr.

(57) ABSTRACT

A ball grid array (BGA) includes a plurality of metal balls adapted for connection between an electrical circuit and a substrate. A first portion of the BGA contains a first group of the metal balls arranged according to a first pitch. A second portion of the BGA contains a second group of metal the balls arranged according to a second pitch that is less than the first pitch, to provide increased metal contact area and correspondingly enhanced thermal transfer capability.

16 Claims, 2 Drawing Sheets

INTEGRATED CIRCUIT PACKAGING WITH BALL GRID ARRAY HAVING DIFFERENTIAL PITCH TO ENHANCE THERMAL PERFORMANCE

FIELD

The invention relates generally to thermal transfer in integrated circuit (IC) packages and, more particularly, to thermal transfer in IC packages that use ball grid array (BGA) technology.

BACKGROUND

Clock speeds at which ICs operate are increasing beyond 1 GHz. These increased clock speeds result in increased power consumption ($P=CV^2f$). The increased power supplied to the device generates additional heat that should be transferred to a substrate such as a printed circuit board. Conventional methods of providing this additional heat transfer include increasing the package size, increasing the silicon size, providing thermal vias, and providing heat spreaders and/or heat sinks. These solutions require added packaging and/or processing costs.

In IC packages that use BGAs (also referred to herein as BGA packages), one known solution is to decrease the pitch of the BGA. This increases the area-density of the metal solder balls, which results in increased metal contact area for thermal conductivity, thereby enhancing heat transfer without increasing package size. FIG. 1 shows a conventional example of a 12×12 mm BGA package, including a BGA that contains 624 solder balls arranged according to a pitch of 0.4 mm. The BGA of FIG. 1 provides a first subset of the 624 solder balls in an outer peripheral area designated generally at 368. This area contains four L-shaped groups of solder balls arranged generally symmetrically about the center of the array. Each group contains 92 solder balls, so the first subset contained in the area 368 is composed of 4×92=368 solder balls.

The BGA also provides a second subset of the 624 solder balls in an inner area 256 centered on the array center. This area 256 is generally rectangular, and contains a 16×16 array of solder balls, for a total of 256 solder balls in the second subset. Four groups of the solder balls in the second subset are connected to a VDD1 power supply node of the IC. As shown in bold in FIG. 1, each VDD1 group is rectangular-shaped and contains 12 solder balls, arranged in 3 rows by 4 columns (where columns extend from top to bottom in FIG. 1, and rows left to right). The four VDD1 groups are arranged generally symmetrically about the center of the area 256, located at the outer peripheral corners of the area 256. The four VDD1 groups thus constitute four physically distinguishable, gang-routed connections to VDD1, and collectively contain 4×12=48 solder balls.

The second subset of solder balls also includes, adjacent the two interior boundaries of each of the four VDD1 groups, a generally flag-shaped group of 16 solder balls connected to a VDD2 power supply node of the IC. Two of the four flag-shaped VDD2 groups are encircled in the top portion of the area 256. The flag-shaped VDD2 groups are arranged generally symmetrically about the center of the area 256. The four VDD2 groups constitute four physically distinguishable, gang-routed connections to VDD2, and collectively contain 4×16=64 solder balls.

The second subset of solder balls further includes, adjacent each of the four flag-shaped VDD2 groups (opposite from the adjacent VDD1 group) a generally rectangular-shaped group of 12 solder balls (3 rows by four columns) connected to a VDD3 power supply node of the IC. The four VDD3 groups, encircled in FIG. 1, are arranged generally symmetrically about the center of the area 256. The four VDD3 groups constitute four physically distinguishable, gang-routed connections to VDD3, and collectively contain 4×12=48 solder balls.

The remainder of the solder balls in the second subset within area 256 are connected as a group to a VSS power supply node of the IC. This VSS group includes a generally rectangular-shaped set of 64 solder balls (8 rows by 8 columns) generally centered on the center of the area 256. The VSS group further includes two generally rectangular-shaped sets of 8 solder balls each (2 rows by four columns) extending to the left and right boundaries of the area 256, between the VDD3 groups. The VSS group also includes two further generally rectangular-shaped sets of 8 solder balls each (4 rows by two columns) extending to the top and bottom boundaries of the area 256, between the VDD2 groups. The VSS group thus constitutes a gang-routed connection to VSS, and contains 64+(4×8)=96 solder balls.

The 256 solder balls in area 256, and the 368 solder balls in area 368, are arranged at a decreased pitch (0.4 mm in FIG. 1) that is designed to maximize the contact area for thermal transfer. If as few as twenty additional solder balls are obtained by using the decreased BGA pitch, a measurable improvement in thermal performance is achieved. However, the extent to which the BGA pitch may be decreased is limited (for example, to the 0.4 mm pitch in FIG. 1) because solder assembly requirements for final deployment impose a lower limit on the distance between adjacent solder balls (e.g., to avoid solder bridging between adjacent balls).

It is desirable in view of the foregoing to provide for increasing the thermal transfer capacity in BGA packages beyond what is achievable in the prior art.

DETAILED DESCRIPTION

The present work recognizes that solder bridging between metal solder balls in gang-routed connections is acceptable, so the BGA pitch associated with these connections may be decreased to a solder ball spacing less than conventionally required for solder assembly, with no increase in package size, and with no other impact on design, production or assembly. This increases the area-density of the solder balls where gang-routed connections are located, which provides increased metal contact area and correspondingly enhanced thermal transfer capability as well as correspondingly enhanced current capacity).

According to example embodiments of the present work, a BGA including a plurality of solder balls has first and second areas that respectively contain first and second subsets of the solder balls, and the solder balls of the first and second subsets are respectively arranged according to first and second pitches that differ from one another. The first subset contains solder balls that are subject to the aforementioned solder assembly limit (e.g., because they respectively connect to individual nodes). The second subset is a group of solder balls that are all connected to a single electrical node, such that the group of solder balls provides a gang-routed connection to the node. Accordingly, the spacing between the solder balls of the second subset is not strictly subject to the solder assembly limit, because solder bridging between the balls of the gang-routed connection is acceptable. This permits the second pitch to be lower than the first pitch, even if the first pitch is set at the solder assembly limit distance.

In some embodiments, a plurality of solder ball groups respectively define a plurality of areas of the BGA, and are arranged according to a lower pitch, while the remaining solder balls in the remaining area of the BGA are arranged according to a higher pitch. In some embodiments, all solder balls of each lower pitch group are connected to a single electrical node that respectively corresponds to that group, such that each of the lower pitch groups of solder balls provides a gang-routed connection for the corresponding node. In some embodiments, two (or more) of the lower pitch groups are contiguous with one another in the array. In some embodiments, the solder balls of two (or more) of the lower pitch groups are all connected to a single electrical node, but other solder balls of the BGA that are not connected to that node are interposed between these lower pitch groups, so that the solder balls of the respective lower pitch groups provide two (or more) physically distinguishable gang-routed connections for the node.

Figure 1:
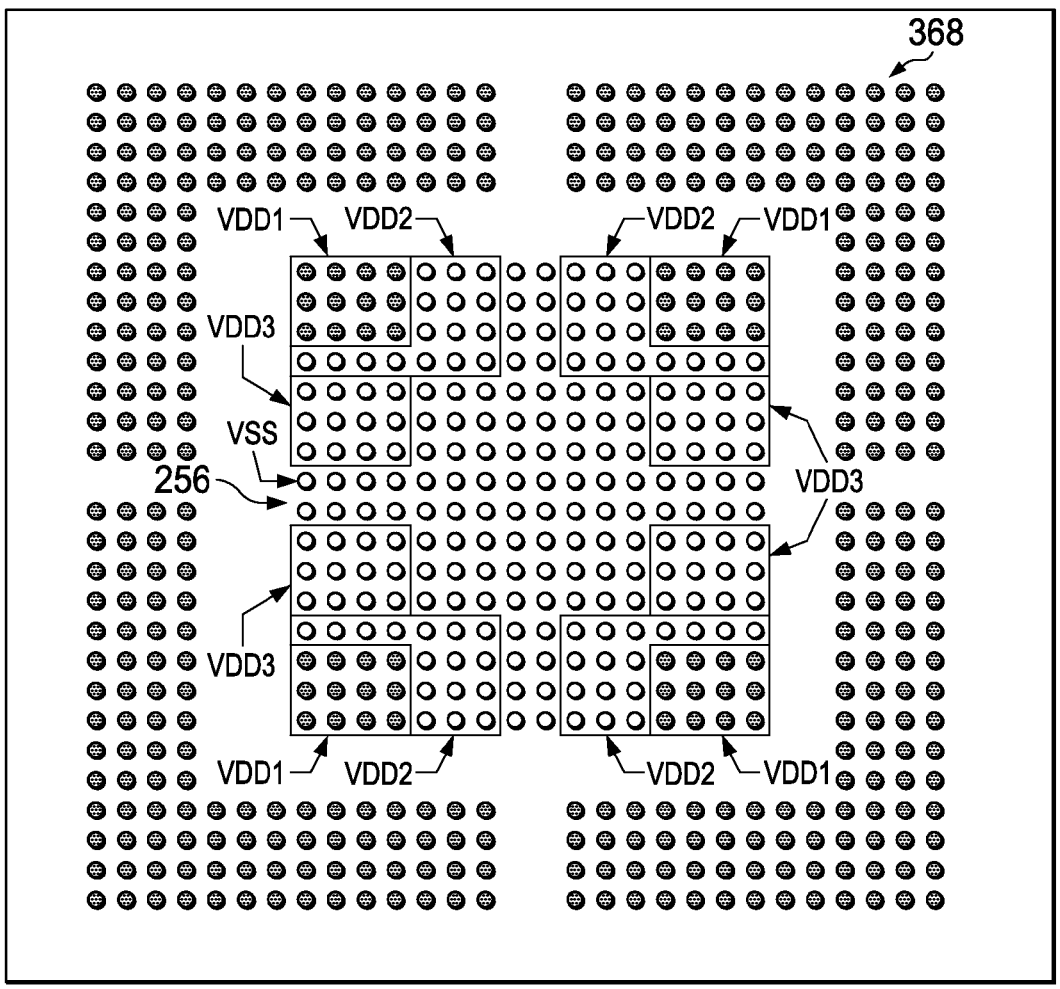
FIG. 1 diagrammatically illustrates a conventional BGA.
Figure 2:
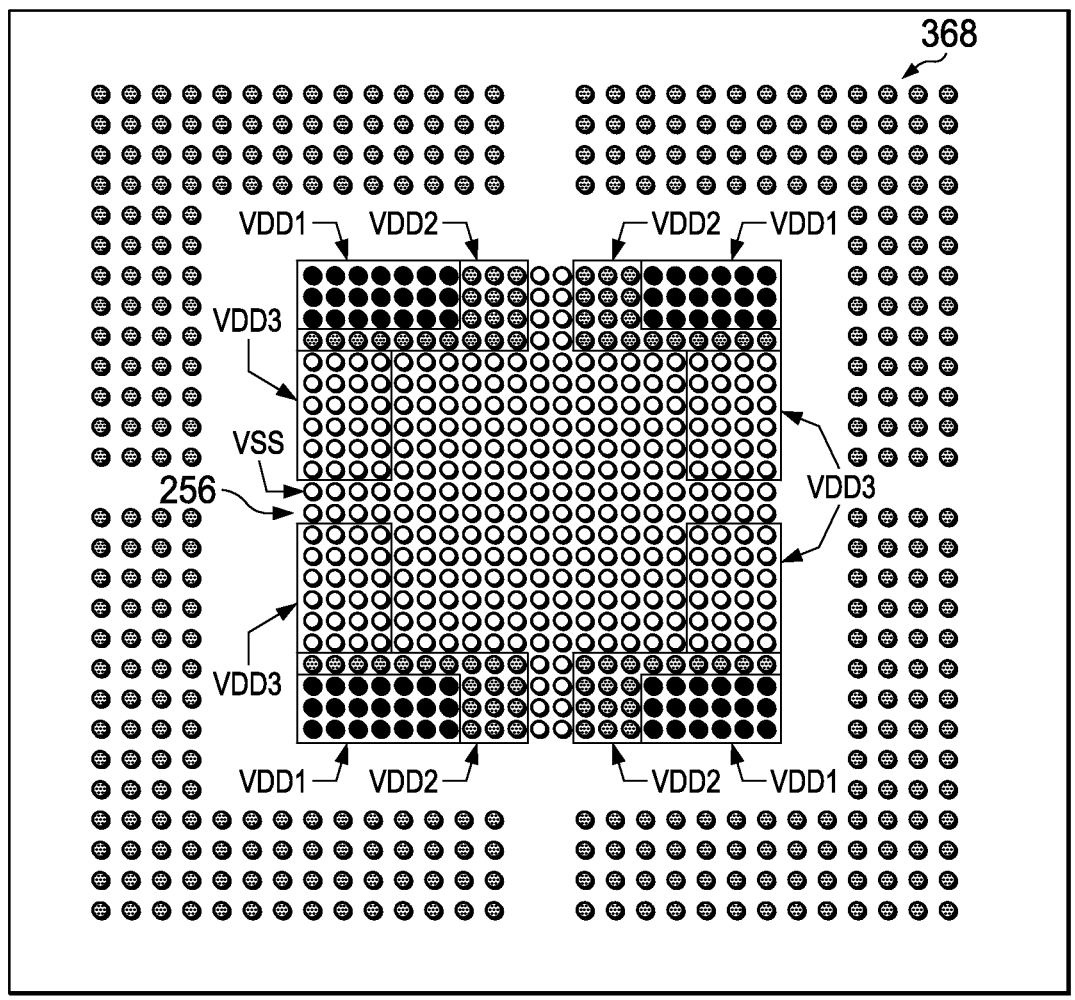
FIG. 2 diagrammatically illustrates a BGA according to example embodiments of the present work.

FIG. 2 shows a BGA package according to example embodiments of the present work. The example shown in FIG. 2 is 12×12 mm BGA package similar to that of FIG. 1, except solder balls in the area 256 are arranged according to a pitch of 0.3 mm. The area 368 in FIG. 2 has the aforementioned 0.4 mm pitch as in FIG. 1, and thus contains 368 solder balls as in FIG. 1. The area 256 in FIG. 2 includes solder balls allocated to each of the thirteen groups (the VSS group, the four VDD1 groups, the four VDD2 groups, and the four VDD3 groups) contained in the area 256 of FIG. 1. Because the solder balls of each group are all connected to a common node corresponding to that group, the pitch of the solder balls in the group is not subject to the aforementioned solder assembly limit (e.g., the 0.4 mm limit mentioned above with respect to FIG. 1). Accordingly, the pitch of the solder balls in the area 256, including the pitch within each of the thirteen constituent areas respectively defined by the aforementioned thirteen solder ball groups, may be decreased beyond the solder assembly limit as shown, with no increase in package size, and with no other impact on design, assembly or production. This advantageously provides more solder balls within the area 256, thereby increasing the metal contact area available for thermal conductivity, resulting in improved thermal performance. The increased metal contact area also results in decreased electrical parasitics. Resistance and inductance decrease with increased metal contact area.

In the example of FIG. 2, the area 256 contains a generally rectangular array of solder balls of dimension 21×22=462, as compared to the 256 solder balls contained in the same area 256 of the package in FIG. 1. As shown by the bold and encircled portions in FIG. 2, the decreased pitch provides, in each of the VDD1, VDD2 and VDD3 groups, more solder balls than in the corresponding groups in FIG. 1. In particular, in FIG. 2 there are: 78 total solder balls in the four VDD1 groups of FIG. 2 (compared to 48 in FIG. 1); 74 total solder balls in the four VDD2 groups of FIG. 2 (compared to 64 in FIG. 1); and 96 total solder balls in the four VDD3 groups of FIG. 2 (compared to 48 in FIG. 1). The remaining 214 (462−(78+74+96)) solder balls are contained in the VSS group of FIG. 2 (compared to 96 in FIG. 1).

In various embodiments, the solder balls of FIG. 2 have various diameters. For example, in some embodiments, all solder balls in the arrangement of FIG. 2 have the same diameter as the solder balls in the prior art example of FIG. 1, for example, 250 um. As another example, in some embodiments, all solder balls in FIG. 2 may have a reduced diameter (e.g., 200 um) relative to the diameter of the solder balls in the prior art example of FIG. 1.

Even in embodiments that use reduced-diameter solder balls, there are still enough additional balls (due to the above-described tighter pitch area of the present work) to provide more metal contact area than conventional arrangements that use larger balls. As an illustration, consider again the aforementioned examples of 200 um diameter balls in FIG. 2, and 250 um diameter balls in FIG. 1. The greater number (462) of 200 um balls in area 256 of FIG. 2 provides 15.5% more metal contact area than the smaller number (256) of 250 um balls in the corresponding area of FIG. 1, i.e., $(462 \times 100^2)/(256 \times 125^2) = 1.155$.

Although the present work is described above in terms of selectively decreasing the BGA pitch in areas where balls associated with gang-routed power supply nodes are located, other embodiments provide selectively decreased BGA pitch in areas where balls associated with other gang-routed nodes are located. Some embodiments provide selectively decreased pitch both in areas where balls associated with gang-routed power supply nodes are located, and in areas where balls associated with other gang-routed nodes are located.

Figure 3:
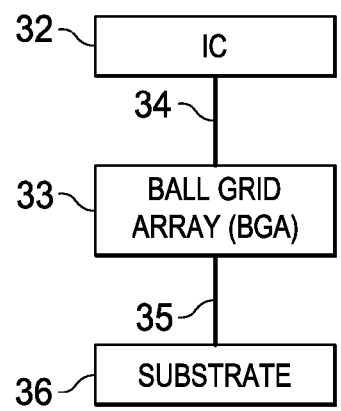
FIG. 3 diagrammatically illustrates a BGA package mounted on a substrate according to example embodiments of the present work.

FIG. 3 diagrammatically illustrates an IC package mounted on a substrate according to example embodiments of the present work. As shown, the IC package includes an IC 32 and a BGA 33, for example, the BGA of FIG. 2. In some embodiments, circuitry of the IC 32 is electrically coupled at 34 to the BGA 33 according to conventional techniques. Solder balls (not explicitly shown in FIG. 3) of the BGA 33 are soldered at 35 to a substrate 36 (e.g., a printed circuit board) on which the IC package is deployed.

Although example embodiments of the present work have been described above in detail, this does not limit the scope of the work, which can be practiced in a variety of embodiments.

What is claimed is:

1. An integrated circuit apparatus, comprising:
   electrical circuitry; and
   a ball grid array (BGA) including a plurality of metal balls electrically coupled to said electrical circuitry, said BGA having a first area that contains a first group of said metal balls arranged according to a first pitch, and said BGA having a second area that contains a second group of said metal balls arranged according to a second pitch that is less than said first pitch, wherein said first pitch defines a distance between said metal balls of said first group that is at least as great as a solder assembly limit distance, and wherein said second pitch defines a distance between said metal balls of said second croup that is less than said solder assembly limit distance.

2. The apparatus of claim 1, wherein all of said metal balls of said second group are connected to a single node of said electrical circuitry.

3. The apparatus of claim 2, wherein said first pitch defines a distance between said metal balls of said first group that is at least as great as a solder assembly limit distance, and wherein said second pitch defines a distance between said metal balls of said second group that is less than said solder assembly limit distance.

4. The apparatus of claim 2, wherein said BGA has a third area that contains a third group of said metal balls that are arranged according to said second pitch and are all connected to a single node of said electrical circuitry.

5. The apparatus of claim 4, wherein said metal balls of said second and third groups are all connected to a same single node of said electrical circuitry, and wherein some of said plurality of balls that are connected to at least one node of said electrical circuitry other than said same single node are interposed between said second and third groups.

6. The apparatus of claim 4, wherein said metal balls of said second and third groups are connected to respectively different single nodes of said electrical circuitry, and wherein said second and third groups are contiguous with one another in said BGA.

7. The apparatus of claim 6, wherein said different single nodes are different power supply nodes.

8. The apparatus of claim 2, wherein said single node is a power supply node.

9. The apparatus of claim 1, wherein said second group defines said second area.

10. An electrical circuit apparatus, comprising:
   electrical circuitry; and
   a ball grid array (BGA) including a plurality of metal balls electrically coupled to said electrical circuitry, said BGA having a first area that contains a first group of said metal balls arranged according to a first pitch, and said BGA having a second area that contains a second group of said metal balls arranged according to a second pitch that is less than said first pitch, wherein said first pitch defines a distance between said metal balls of said first group that is at least as great as a solder assembly limit distance, and wherein said second pitch defines a distance between said metal balls of said second group that is less than said solder assembly limit distance.

11. The apparatus of claim 10, wherein all of said metal balls of said second group are connected to a single node of said electrical circuitry.

12. The apparatus of claim 11, wherein said first pitch defines a distance between said metal balls of said first group that is at least as great as a solder assembly limit distance, and wherein said second pitch defines a distance between said metal balls of said second group that is less than said solder assembly limit distance.

13. The apparatus of claim 11, wherein said BGA has a third area that contains a third group of said metal balls that are arranged according to said second pitch and are all connected to a single node of said electrical circuitry.

14. The apparatus of claim 13, wherein said metal balls of said second and third groups are all connected to a same single node of said electrical circuitry, and wherein some of said plurality of balls that are connected to at least one node of said electrical circuitry other than said same single node are interposed between said second and third groups.

15. The apparatus of claim 13, wherein said metal balls of said second and third groups are connected to respectively different single nodes of said electrical circuitry, and wherein said second and third groups are contiguous with one another in said BGA.

16. A ball grid array structure having a plurality of metal balls adapted for connection between an electrical circuit and a substrate, comprising:
   a first portion that contains a first group of said metal balls arranged according to a first pitch, wherein said first pitch defines a distance between said metal balls of said first group that is at least as great as a solder assembly limit distance, and wherein said second pitch defines a distance between said metal balls of said second group that is less than said solder assembly limit distance; and
   a second portion that contains a second group of said metal balls arranged according to a second pitch that is less than said first pitch.

\* \* \* \* \*